United States Patent [19]
Chung

[11] Patent Number: 6,128,231
[45] Date of Patent: Oct. 3, 2000

[54] NONVOLATILE SEMICONDUCTOR MEMORY DEVICE CAPABLE OF OPTIMIZING PROGRAM TIME

[75] Inventor: Hwi-Taek Chung, Kyunggi-do, Rep. of Korea

[73] Assignee: Samsung Electronics. Co., Ltd., Suwon, Rep. of Korea

[21] Appl. No.: 09/448,077

[22] Filed: Nov. 23, 1999

[30] Foreign Application Priority Data

Nov. 23, 1998 [KR] Rep. of Korea ...................... 98-50218

[51] Int. Cl.[7] .................................................. G11C 16/12
[52] U.S. Cl. .............................. 365/185.23; 365/185.18; 365/189.09; 365/226
[58] Field of Search ......................... 365/185.18, 185.23, 365/189.09, 226

[56] References Cited

U.S. PATENT DOCUMENTS 5,081,371  1/1992  Wong ....................................... 327/536
5,280,420  1/1994  Rapp .......................................... 363/60
5,511,026  4/1996  Cleveland et al. ................. 365/189.09
5,680,349  10/1997  Atsumi et al. ..................... 365/185.23

*Primary Examiner*—Andrew Q. Tran
*Attorney, Agent, or Firm*—Marger Johnson & McCollom, P.C.

[57] ABSTRACT

Disclosed herein is a nonvolatile semiconductor memory device which comprises a voltage level sensing circuit for detecting whether a word line voltage and a bit line voltage are boosted up to their target levels for a program operation. When the voltages are boosted up to the target levels, the voltage level sensing circuit generates a pulse signal for indicating that the word line and bit line voltages are sufficiently boosted up to the target levels. The nonvolatile semiconductor memory device realized according to this scheme can reduce a program time when it is implemented using the higher power supply voltage. Therefore, optimized program time of the memory device according to the present invention is secured.

10 Claims, 6 Drawing Sheets

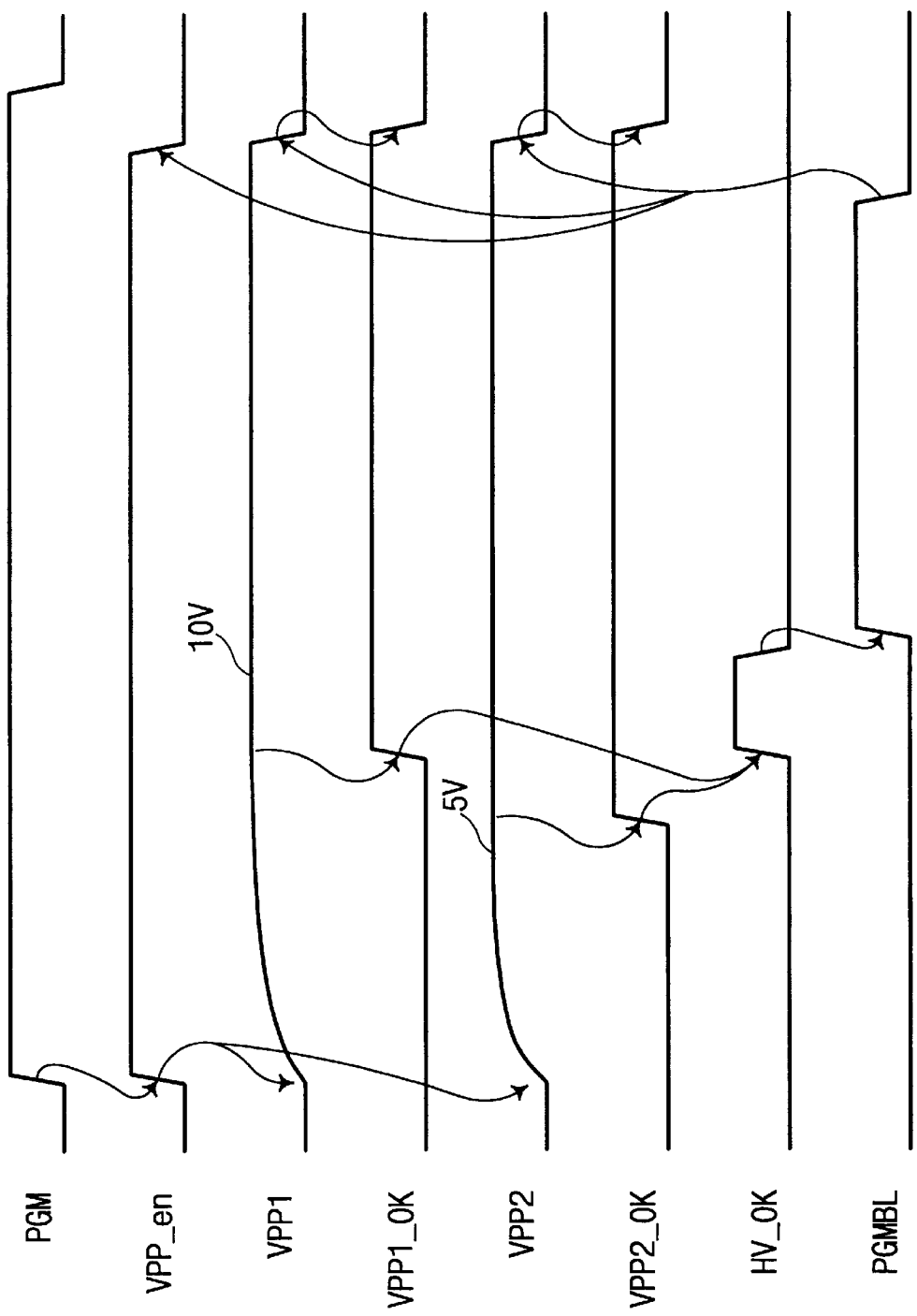

NONVOLATILE SEMICONDUCTOR MEMORY DEVICE CAPABLE OF OPTIMIZING PROGRAM TIME

FIELD OF THE INVENTION

The present invention relates to nonvolatile semiconductor memory devices, and more particularly to a nonvolatile semiconductor memory device capable of optimizing program time depending on power supply voltage level.

BACKGROUND OF THE INVENTION

Generally, semiconductor memory devices for storing data are classified into volatile semiconductor memory devices and nonvolatile semiconductor memory devices. The volatile semiconductor memory devices lose their data at power-off, and the nonvolatile semiconductor memory devices maintain their data even at power-off. Therefore, the nonvolatile semiconductor memory devices have been widely used at applications in which power can be interrupted suddenly.

The nonvolatile semiconductor memory devices comprise electrically erasable and programmable ROM cells which are referred to as "flash EEPROM cells." Commonly, a flash EEPROM cell, as illustrated in FIG. 1, has a semiconductor substrate (or bulk) 2 of a first conductive type (e.g., P type), source and drain regions 3 and 4 of a second conductive type (e.g., N type) spaced apart relative to each other, a floating gate 6 storing charges and placed over a channel region between the source and drain regions 3 and 4, and a control gate 8 placed over the floating gate 6. Operation of the flash EEPROM cell includes program, erase and read operations.

The program operation of the flash EEPROM cell is performed by biasing the drain region 4 with a positive voltage (e.g., 5V–6V) and the control gate 8 with high voltage (e.g., 10V). At this time, the source region 3 and the bulk 2 are grounded. In the case where charges stored in the floating gate 6 doesn't exist, the bias voltages cause an inversion-layer channel of charges to be formed on a surface of the bulk 2 between the source and drain regions 3 and 4. As is well known to ones skilled in the art, the drain-source voltage accelerates charges into the drain region through the inversion-layer channel. Charges thus accelerated gain very high kinetic energy and are named "hot electrons". The hot electrons are accumulated on the floating gate 6 via a mechanism which is referred to as hot electron injection.

As is well known to ones skilled in the art, as a large amount of charges accumulate on the floating gate, the effective threshold voltage ($V_{th}$) of a cell transistor is increased. As the effective threshold voltage is increased in a range of about 6V to 7V, the cell transistor enters a nonconductive state (i.e., off state) when a read voltage is applied to the control gate during a read operation. In a state known as a program state, the flash EEPROM cell stores logic '0' (or logic '1' depending on the program mask). Once programmed, the flash EEPROM cell maintains its effective threshold voltage even at power-off.

The erase operation of the flash EEPROM cell is performed by eliminating charges stored in the floating gate. The flash EEPROM cell is erased, for example, by applying a negative high voltage (e.g., −10V) to the control gate 8 and a positive voltage (e.g., +6V) to the bulk 2. At this time, the source and drain regions 3 and 4 are maintained at a floating state of high-impedance. By such a bias condition, an electric field of about 6–7 MV/cm is formed across a tunneling oxide layer 5 which has a thickness of about 100 Å, and negative charges accumulated in the floating gate 6 are emitted via the tunneling oxide layer 5 to the bulk 2 via a mechanism such as Fowler-Nordheim tunneling. This makes the effective threshold voltage of the cell transistor be reduced to within a range of about 1V to 3V. As its effective threshold voltage is reduced, the cell transistor enters a conductive state (i.e., on state) when a read voltage is applied to the control gate during a read operation. In a state known as an erase state, the flash EEPROM cell stores logic '1' (or logic '0' if no logic inversion).

The read operation of the flash EEPROM cell is performed by applying a read voltage (e.g., 4.5V) to a control gate 8 through a word line and a positive bias voltage (e.g., 1V) to a drain region 4 through a bit line. If programmed, the flash EEPROM cell doesn't conduct cell current, and the bit line connected to the cell is maintained at the bias voltage of 1V. If not programmed (or if erased), the EEPROM cell conducts cell current (e.g., 30 $\mu$A), and the bit line connected thereto is grounded. Therefore, by sensing a bit line voltage (current), the data state (or programmed state) of the flash EEPROM cell (logic '1' or logic '0') may be determined.

As above described, the program operation requires a high voltage which has a voltage level higher than a power supply voltage level. A high voltage generating circuit (or a voltage pumping circuit) for generating the high voltage is disclosed in U.S. Pat. No. 5,081,371 entitled "INTEGRATED CHARGE PUMP CIRCUIT WITH BACK BIAS VOLTAGE REDUCTION" and U.S. Pat. No. 5,280,420 entitled "CHARGE PUMP WHICH OPERATES ON A LOW VOLTAGE POWER SUPPLY".

A prior art nonvolatile semiconductor memory device with a high voltage generating circuit is illustrated in FIG. 2. In FIG. 2, a memory cell array 11 comprises NOR-structured nonvolatile memory cells (flash EEPROM cells) arranged in a matrix form of rows and columns, plural word lines extending along the rows, and plural bit lines extending along the columns. Such an array 11 of NOR-structured memory cells is disclosed in U.S. Pat. No. 5,680,349 entitled "NONVOLATILE SEMICONDUCTOR MEMORY DEVICE HAVING ROW DECODER SUPPLYING A NEGATIVE POTENTIAL TO WORD LINES DURING ERASE MODE" and U.S. Pat. No. 5,511,026 entitled "BOOSTED AND REGULATED GATE POWER SUPPLY WITH REFERENCE TRACKING FOR MULTI-DENSITY AND LOW VOLTAGE SUPPLY MEMORIES", which are hereby incorporated by reference.

As illustrated in FIG. 2, an address buffer circuit 12, a row decoder circuit (X-Decoder) 13, a column decoder circuit (Y-Decoder)14, a column pass gate circuit (Y-Gating) 15 and a write driver circuit 16 are further provided in the memory device 10. Since the above-mentioned constituent elements are well known in the art, further description thereof is omitted. Furthermore, the nonvolatile semiconductor memory device 10 comprises a command register 17, a program controller 18, a high voltage generating circuit 21 consisting of first and second high voltage generators 19 and 20, and a timer 22. The constituent elements will be explained with reference to FIG. 3 which shows a timing diagram for describing a program operation according to the prior art.

When the program operation for the memory cells is required, external command codes defined by address signals XAi and data DQi are continuously inputted to the command register 17 in synchronism with a write enable signal WEB, so that the memory device 10 enters a program mode. The command register 17 generates a program enable signal PGM indicating the program operation in response to the command codes (i.e., address signals and data), and the program controller 18 responds to the program enable signal PGM to generate a high voltage enable signal VPP_en for activating the high voltage generating circuit 21. Next, the row decoder circuit 13 selects a word line associated with a row address which is applied through the address buffer circuit 12, and the column decoder circuit 14 and the column pass gate circuit 15 select bit lines associated with a column address which is applied through the address buffer circuit 12.

As shown in FIG. 3, when a high voltage enable signal VPP_en from the program controller 18 transitions from a logic low level to a logic high level in synchronism with a low-to-high transition of the signal PGM, the first and second high voltage generators 19 and 20 start to generate high voltages VPP1 and VPP2 each of which is higher than the power supply voltage. The first high voltage VPP1 is a voltage of about 10V which is supplied to a selected word line through the row decoder circuit 13, and is hereinafter referred to as a word line voltage. The second high voltage VPP2 is a voltage of about 5V which is supplied to a selected bit line through the column pass gate circuit 15 via the write driver circuit 16, and is hereinafter referred to as a bit line voltage). At the same time, an output pulse signal C from the timer 22 is activated high when the high voltage enable signal VPP_en changes from a logic low level to a logic high level, and then is inactivated low after a predetermined time (corresponding to a time in which the high voltages VPP1 and VPP2 are pumped up to their required voltages) elapses. The program controller 18 generates a control signal PGMBL for controlling the write driver circuit 16 when the output pulse signal C from the timer 22 transitions from high to low. This leading edge of PGMBL forces the write driver circuit 16 to drive the selected bit line according to a data state to be programmed. After a time elapses (a selected memory cell is programmed), the control signal PGMBL is inactivated low by the program controller 18.

As above described, the prior art memory device 10 in FIG. 2 has the timer 22 for generating the output pulse signal C to be activated during a predetermined time so as to determine a time when the high voltage VPP2 is applied to a selected bit line. The duration of enable period $t_A$ of the output pulse signal C may be determined—by testing, e.g. a circuit simulation, a time when the high voltage generating circuit 21 generates the high voltages VPP1 and VPP2 with a required voltage level considering various power supply voltages in accordance with applied fields. As is well known to those skilled in the art, a high voltage generator using higher power supply voltage generates voltage more rapidly than one using lower power supply voltage. Therefore, the enable period $t_A$ of the output pulse signal C may be determined on the basis of the high voltage generator using the lower power supply voltage.

According to the above description, the enable period $t_A$ of the output pulse signal C, which is implemented in the memory device using the higher power supply voltage, is determined by the timer 22 which is implemented in the memory device using the lower power supply voltage. That is, a point in time of a high-to-low transition of the signal C at the higher power supply voltage is limited by that at the lower power supply voltage. For this reason, a loss of total program time of the memory device using the higher power supply voltage is inevitable.

SUMMARY OF THE INVENTION

It is therefore an object of the present invention to provide a nonvolatile semiconductor memory device capable of optimizing program time depending on applied power supply voltage.

In order to attain the above objects, according to an aspect of the present invention, there is provided a novel nonvolatile semiconductor memory device comprising a voltage level sensing circuit for detecting respective levels of a word line voltage and a bit line voltage when a program operation is performed. The voltage level sensing circuit generates a pulse signal when the word line voltage and the bit line voltage are pumped up to respective required voltage levels. Then, a program controller generates a control signal for controlling a time when the bit line voltage is supplied to a selected bit line. According to this control scheme, optimized program time for the nonvolatile semiconductor memory device is achieved regardless of the power supply voltage applied to the memory device.

BRIEF DESCRIPTION OF THE DRAWINGS

The present invention will be described by way of exemplary embodiments, but not limitations, illustrated in the accompanying drawings in which like references denote similar elements, and in which:

FIG. 6 shows a timing diagram of a program operation according to the present invention.

DESCRIPTION OF THE PREFERRED EMBODIMENT

Figure 1:
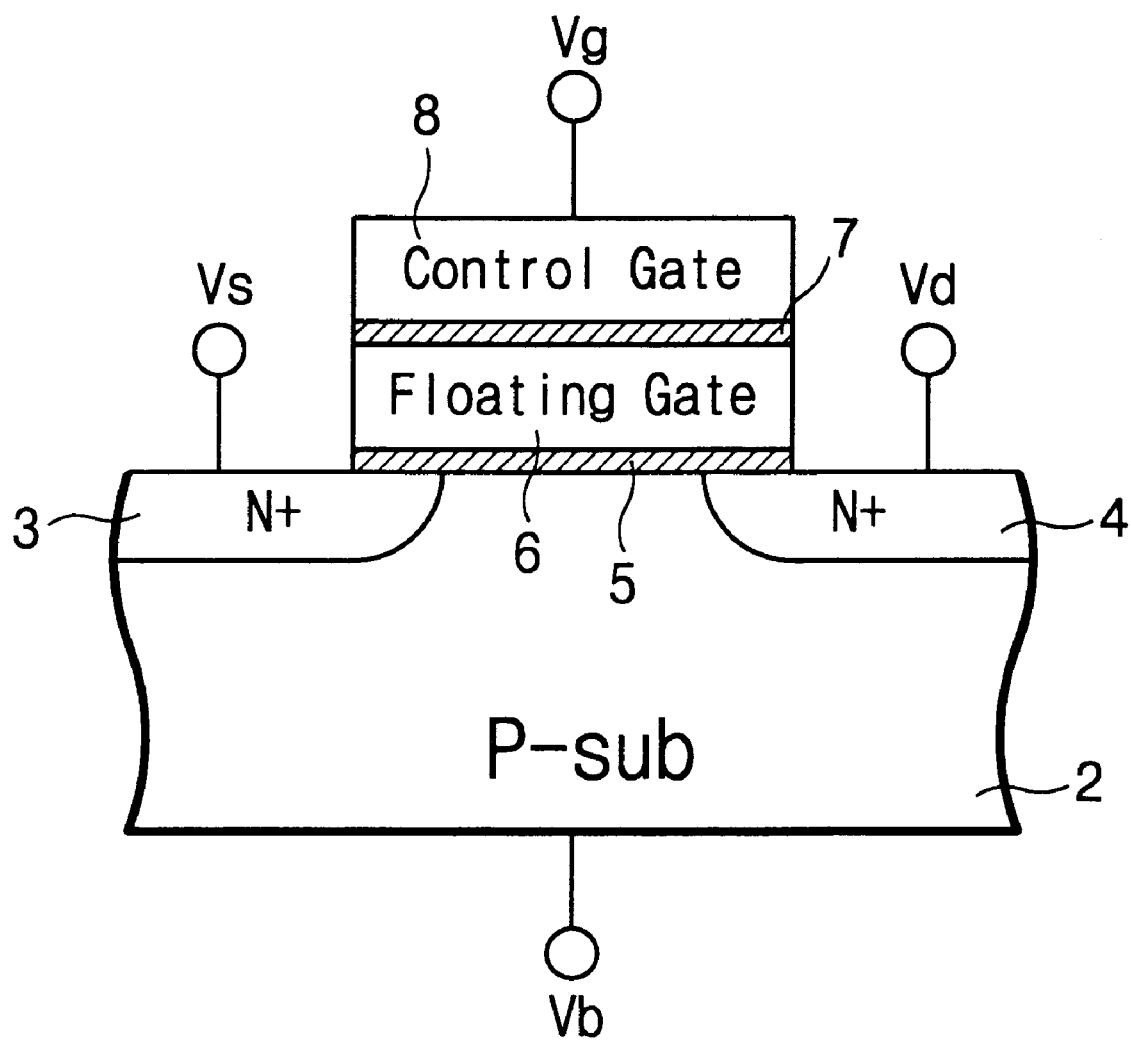
FIG. 1 is a cross-sectional diagram showing the structure of a flash EEPROM cell.
Figure 2:
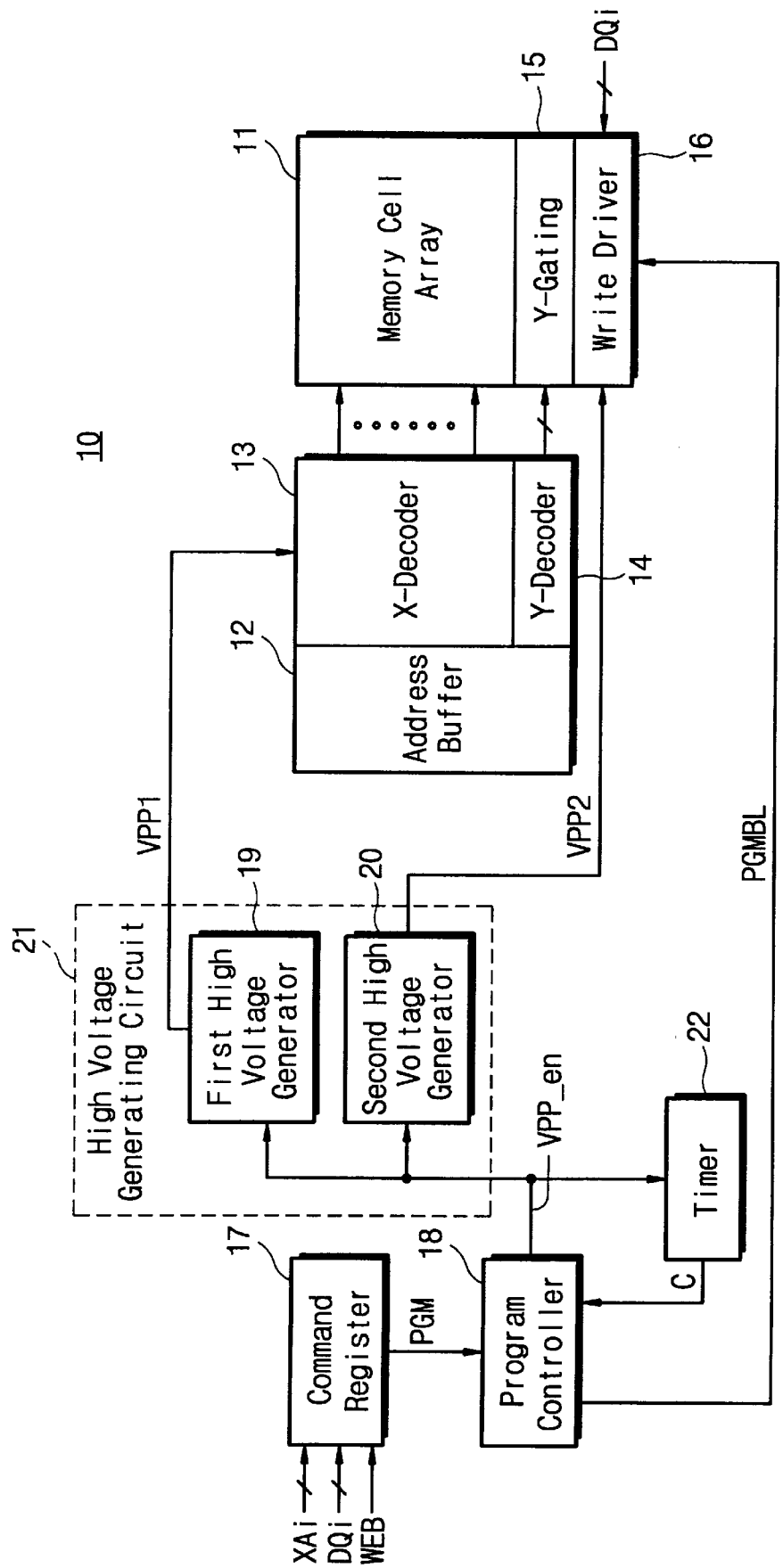
FIG. 2 shows a block diagram of a prior art nonvolatile semiconductor memory device.
Figure 3:
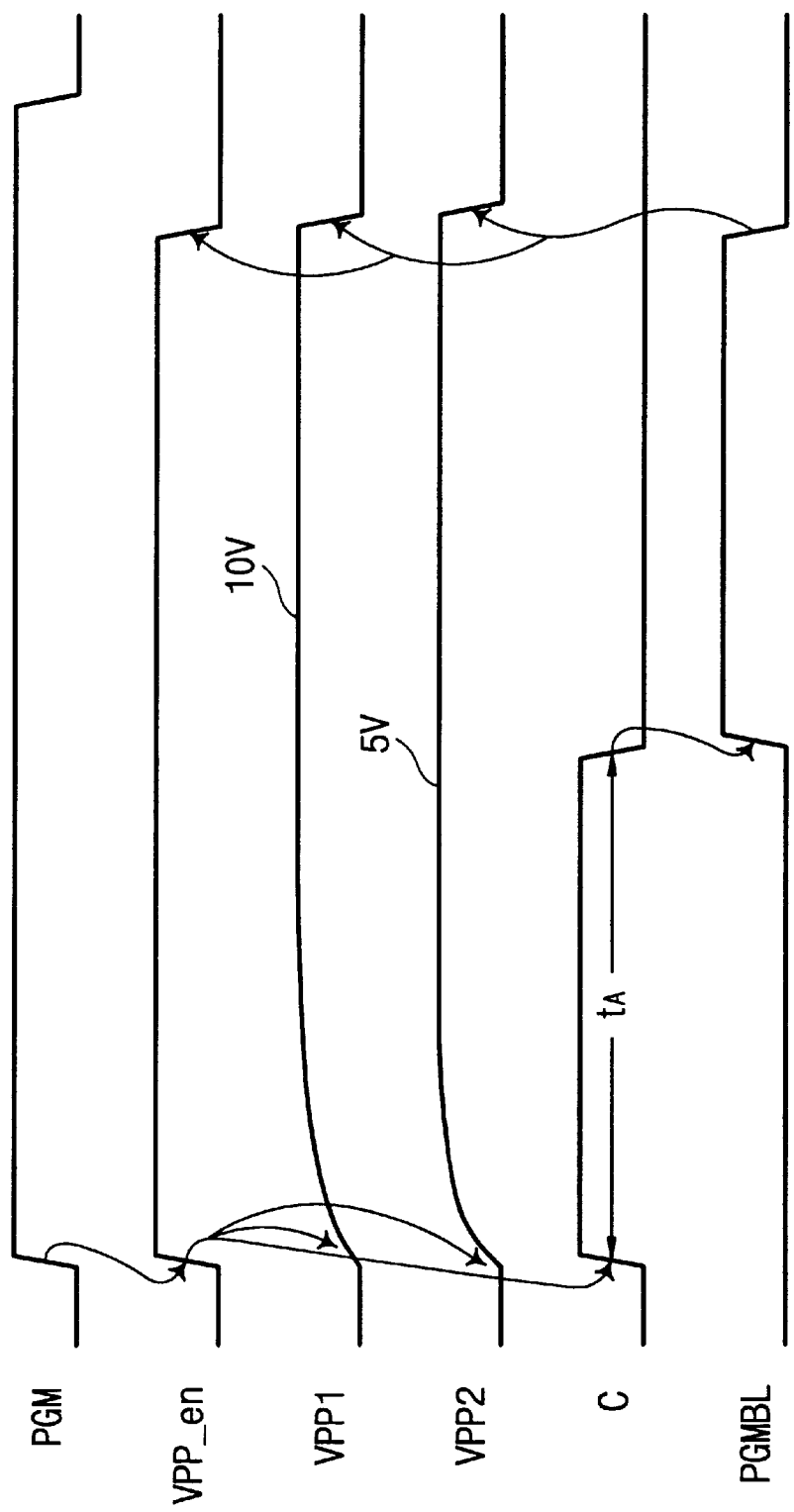
FIG. 3 shows a timing diagram for describing a program operation according to the prior art.
Figure 4:
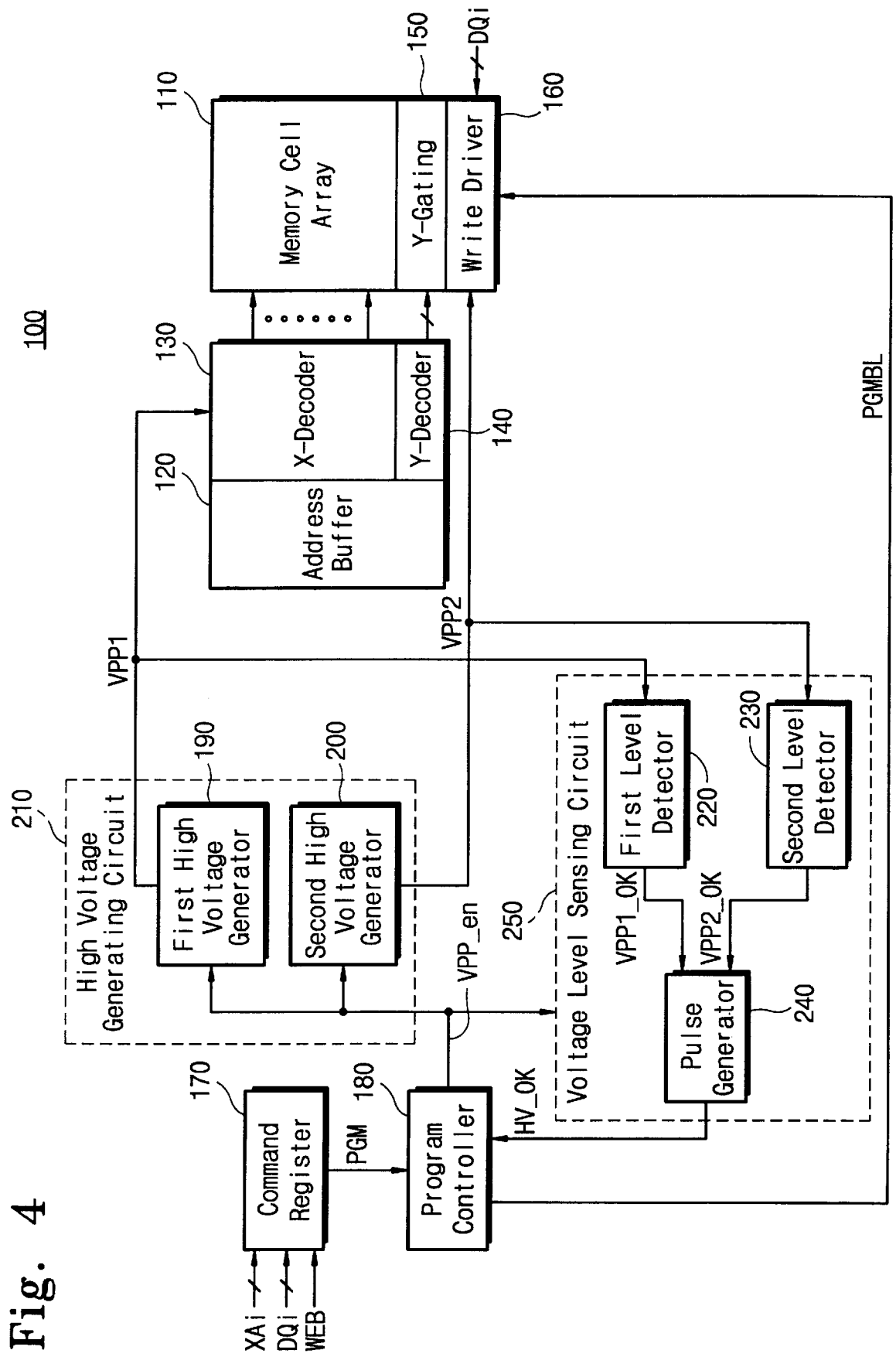
FIG. 4 shows a block diagram of a nonvolatile semiconductor memory device according to the present invention.
Figure 5:
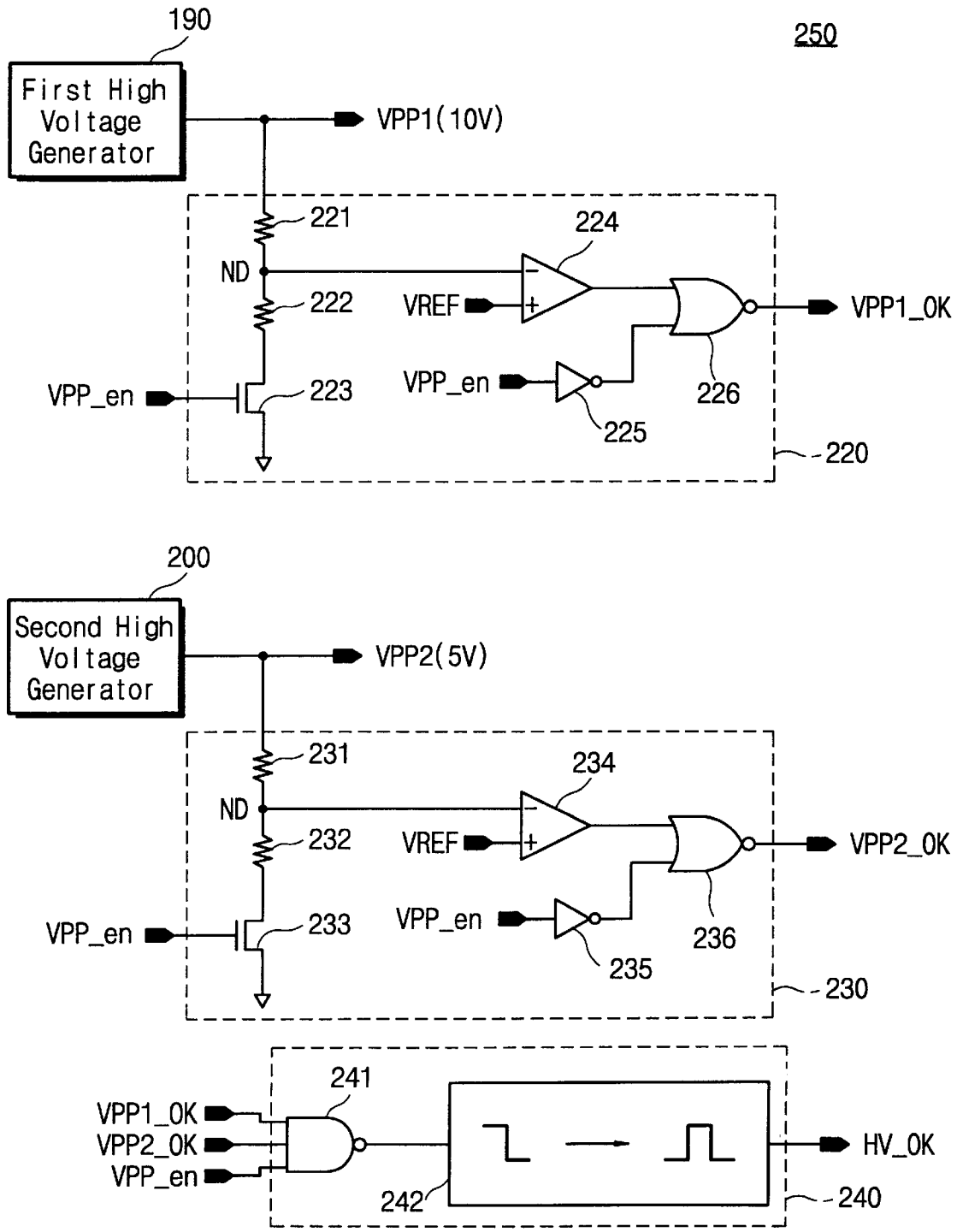
FIG. 5 shows a preferred embodiment of the voltage level sensing circuit in FIG. 4.

Hereinafter, the preferred embodiment according to the present invention will be more fully explained with reference to the accompanying drawings. FIG. 4 shows a block diagram of a nonvolatile semiconductor; memory device according to the present invention, and FIG. 5 shows a preferred embodiment of the voltage level sensing circuit in FIG. 4.

Referring to FIG. 4, first, a memory cell array 110 comprises NOR-structured nonvolatile memory cells (flash EEPROM cells) arranged in a matrix form of rows and columns, plural word lines extending along the rows from X-Decoder 130, and plural bit lines extending along the columns from Y-Decoder 140 through Y-Gating 150. The array of NOR-structured memory cells is disclosed in the above-mentioned '349 and '026 patents.

A row decoder circuit (X-Decoder)130 selects a word line corresponding to a row address which is provided through an address buffer circuit 120, and supplies the selected word line with a high voltage VPP1 from a high voltage generating circuit 210 (i.e. the word line voltage of about 10V). A column decoder circuit (Y-Decoder) 140 and a column pass gate circuit (Y-Gating) 150 select bit lines in response to a column address which is provided through the address buffer circuit 120, and the number of selected bit lines is determined in accordance with a bit organization (e.g., x8). When a control signal PGMBL from a program controller 180 is activated, a write driver circuit 160 drives the selected bit lines with a high voltage VPP2 from the high voltage generating circuit 210 (i.e, the bit line voltage of about 5V) depending on data to be programmed in memory cells designated by the selected word line and bit lines.

In order that a program operation for the NOR-structured memory cells is invoked, external command codes defined by address signals XAi and data DQi are continuously inputted to the command register 170 in synchronism with a write enable signal WEB, so that the memory device 100 enters a program mode. The command register 170 generates a program enable signal PGM indicating the program operation by use of the command codes (i.e., address signals and data), and the program controller 180 responds to the program enable signal PGM to generate a high voltage enable signal VPP_en for activating the high voltage generating circuit 210.

A first high voltage generator 190 of the high voltage generating circuit 210 starts to generate a word line voltage VPP1 of about 10V in response to the high voltage enable signal VPP_en. At the same time, the word line voltage VPP1 thus generated is supplied to the selected word line through the row decoder circuit (X-Decoder) 130. And, a second high voltage generator 200 thereof starts to generate a bit line voltage VPP2 of about 5V in response to the high voltage enable signal VPP_en. But, the bit line voltage VPP2 thus generated is not supplied to the selected bit lines, because a control signal PGMBL for controlling the write driver circuit 160 is not yet activated.

Continuing to refer to FIG. 4, the voltage level sensing circuit 250 performs its sense operation when the high voltage enable signal VPP_en is activated. Sensing circuit 250 comprises a first level detector 220, a second level detector 230 and a pulse generator 240. The first level detector 220 receives the voltage VPP1 (i.e., a word line voltage) from the first high voltage generator 190 to detect whether the voltage VPP1 is boosted up to a required voltage level (e.g., 10V). The first level detector 220 generates a first detection signal VPP1_OK of a logic low level when the voltage VPP1 has not yet reached its target level, and generates the first detection signal VPP1_OK of a logic high level when the voltage VPP1 reaches its target level. Similarly, the second level detector 230 receives the voltage VPP2 (i.e., a bit line voltage) from the second high voltage generator 200 to detect whether the voltage VPP2 is boosted up to a required voltage level (e.g., 5V). The second level detector 220 generates a second detection signal VPP2_OK of a logic low level when the voltage VPP2 has not yet reached its target level, and generates the second detection signal VPP2_OK of a logic high level when the voltage VPP2 reaches its target level.

Referring to FIG. 5, first and second level detectors 220, 230 and pulse generator 240 will be described in more detail. The first level detector 220 is coupled to the first high voltage generator 190, and includes two resistors 221 and 222, an NMOS transistor 223, a differential amplifier 224 serving as a comparator, an inverter 225 and a NOR gate 226. The resistors 221 and 222 are serially coupled between the high voltage VPP1 and the NMOS transistor 223, which is switched on/off depending on the high voltage enable signal VPP_en. One input terminal (—) of the amplifier 224 is coupled to a connection node ND of the resistors 221 and 222, and the other input terminal (+) thereof is connected to a reference voltage VREF. The NOR gate 226 has one input terminal coupled to an output terminal of the amplifier 224, the other input terminal receiving the high voltage enable signal VPP_en through the inverter 225, and an output terminal outputting the first detection signal VPP1_OK.

As illustrated in FIG. 5, the second level detector 230 is identical to the first level detector 220, and thus a description thereof is omitted.

When the high voltage enable signal VPP_en is activated high, the first level detector 220 starts to performs its detection operation. In the case where a voltage of the connection node ND is less than the reference voltage VREF, the first level detector 220 outputs the first detection signal VPP1_OK of a logic low level. On the other hand, when the voltage of the connection node ND is higher than the reference voltage VREF, the first level detector 220 outputs the first detection signal VPP1_OK of a logic high level. Similarly, when the high voltage enable signal VPP_en is activated high, the second level detector 230 starts to performs its detection operation. In the case where the voltage of the connection node ND is less than the reference voltage VREF, the second level detector 230 outputs the second detection signal VPP2 OK of a logic low level. On the other hand, when the voltage of the connection node ND is higher than the reference voltage VREF, the second level detector 230 outputs the second detection signal VPP2_OK of a logic high level.

Referring to FIG. 4, while the high voltage enable signal VPP_en is activated, the pulse generator 240 generates a pulse signal HV_OK when the first and second detection signals VPP1_OK and VPP2_OK are activated high. As illustrated in FIG. 5, the pulse generator 240 thus may comprise a NAND gate 241 and a short pulse generator 242.

Returning again to FIG. 4, a program controller 180 generates the high voltage enable signal VPP_en in response to the program enable signal PGM of a logic high level, and generates a control signal PGMBL in response to the pulse signal HV_OK from the voltage level sensing circuit 250. The control signal PGMBL is a signal indicating a time when the bit line voltage VPP2 of a required voltage level is transferred to selected bit lines. That is, the program controller 180 generates the control signal PGMBL after the high voltages VPP1 and VPP2 both are boosted up to their target levels.

As can be seen from the above explanation, the voltage level sensing circuit 250 of the present invention automatically senses a high voltage generated time which varies according to a power supply voltage, and then informs its sense result HV_OK to the program controller 180. The nonvolatile semiconductor memory device 100 realized according to this control scheme can reduce the program time when it is implemented using a higher power supply voltage. As a result, optimized program time of the memory device according to the present invention is secured.

FIG. 6 is a timing diagram for describing an operation of the nonvolatile semiconductor memory device according to the present invention. Hereinafter, the program operation of the nonvolatile semiconductor memory device will be more fully explained with reference to the accompanying drawings.

When the program operation for the memory cells is required, external command codes defined by address signals XAi and data DQi are continuously inputted to the command register 170 from an external controller (e.g., a microprocessor or microcontroller) in synchronism with a write enable signal WEB, so that the memory device 100 enters a program mode. The command register 170 generates a program enable signal PGM indicating the program operation by use of the command codes (i.e., address signals and data), and the program controller 180 responds to the program enable signal PGM to generate a high voltage enable signal VPP_en for activating the high voltage generating circuit 210.

And then, the row decoder circuit (X-Decoder) 130 selects a word line associated with a row address which is applied through the address buffer circuit 120, and the column decoder circuit (Y-Decoder) 140 and the column pass gate circuit (Y-Gating) 150 select bit lines associated with a column address which is applied through the address buffer circuit 120.

As shown in FIG. 6, when a high voltage enable signal VPP_en from the program controller 180 transitions from a logic low level to a logic high level, the first and second high voltage generators 190 and 200 start to generate high voltages VPP1 and VPP2 by use of the power supply voltage, each of which has a level higher than the power supply voltage itself. At the same time, the voltage level sensing circuit 250 starts to sense whether the high voltages VPP1 and VPP2 are boosted up to their target levels, and then generates the pulse signal HV_OK when the high voltages VPP1 and VPP2 reach their target levels. That is, the voltage level sensing circuit 250 generates the pulse signal HV_OK indicating that a bias voltage condition capable of performing the program operation has been reached.

Continuously, the program controller 180 responds to the pulse signal HV_OK to generate the control signal PGMBL, indicating a point in time when the high voltage VPP2 is supplied to the selected bit lines. And then, the write driver circuit 160 drives the selected bit lines with the high voltage VPP2 (i.e., the bit line voltage) depending on data to be programmed when the control signal PGMBL is activated high. Therefore, a real program operation is performed by biasing a control gate of a cell transistor with the high voltage VPP1 of about 10V and a drain thereof with the high voltage VPP2 of about 5V. As illustrated in FIG. 6, after a time elapses, that is, the cell transistor is programmed, the control signal PGMBL is inactivated by the program controller 180. That is, the program operation is ended.

According to the voltage level sensing circuit 250 of the present invention, a high voltage generated time which varies according to a power supply voltage, is automatically sensed. The sense result by the sensing circuit 250 informs the program controller 180 that the program voltage target levels have been achieved, and then the real program operation is performed. Therefore, the nonvolatile semiconductor memory device 100 realized according to this control scheme can reduce a program time when it is implemented using the higher power supply voltage. As a result, optimized program time of the memory device according to the present invention is secured.

It is obvious that this control scheme can be applied to NAND structured nonvolatile semiconductor memory device, and to volatile or nonvolatile semiconductor memory device requiring a voltage higher than the power supply voltage on a chip. Although the nonvolatile semiconductor memory device of the present invention is explained using the program operation, the present invention can be applied to various operation modes using the high voltage, such as erase, erase verify, program verify operations.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A nonvolatile semiconductor memory device comprising:
   at least one nonvolatile memory cell for storing data, wherein the memory cell has a source, a drain, a floating gate and a control gate;
   a high voltage generating circuit for generating a first high voltage to be applied to the control gate and a second high voltage to be applied to the drain in response to a first control signal;
   a voltage level sensing circuit for generating a pulse signal when the first and second high voltages are boosted up to defined target levels;
   a program controller for generating a second control signal indicating a time when the second high voltage may be supplied to the drain, in response to the pulse signal; and
   a write driver circuit for driving the drain of the memory cell with the second high voltage in response to the pulse signal.

2. The memory device according to claim 1, further comprising a command register for generating a program enable signal in response to command codes, which are defined by address and data continuously applied from a controller external to the device in synchronism with a write enable signal,
   wherein the program controller generates the first control signal in response to the program enable signal.

3. The memory device according to claim 1, wherein the first high voltage is higher than a power supply voltage, and the second high voltage is between the first high voltage and the power supply voltage.

4. The memory device according to claim 1, wherein the voltage level sensing circuit comprises:
   a first level detector for generating a first detection signal when the first high voltage is boosted up to its target level, in response to the first control signal;
   a second level detector for generating a second detection signal when the second high voltage is boosted up to its target level, in response to the first control signal; and
   a pulse generator for generating the pulse signal when the first and second detection signals are activated, in response to the first control signal.

5. The memory device according to claim 4, wherein each of the first and second level detectors comprise:
   a first resistor having a first terminal coupled to a corresponding high voltage;
   a second resistor having a first terminal coupled to a second terminal of the first resistor and a second terminal grounded;
   a comparator having a first input terminal coupled to a connection node of the first and second resistors and a second input terminal coupled to a reference voltage; and
   a NOR gate having a first input terminal coupled to an output terminal of the comparator, a second input terminal coupled to the first control signal through an inverter, and an output terminal outputting a corresponding detection signal.

6. The memory device according to claim 5, wherein each of the first and second level detectors further comprise a MOS transistor which is coupled to the second terminal of the second resistor and to a ground voltage, the MOS transistor being switched on/off depending on the first control signal.

7. The memory device according to claim 4, wherein the pulse generator comprises:
   a NAND gate having a first, a second and a third input terminal each receiving the first detection signal, the second detection signal and the first control signal; and
   a short pulse generator connected to an output terminal of the NAND gate, for generating the pulse signal when a signal outputted from the NAND gate transitions from a first logic state to a second logic state.

8. A nonvolatile semiconductor memory device comprising:
   a memory cell array having a plurality of word lines, a plurality of bit lines, and a plurality of memory cells arranged at intersections of the word lines and the bit lines, each of the memory cells having a drain, a source, a floating gate and a control gate;
   a row selecting circuit for selecting one of the word lines in response to a row address during a program operation;
   a high voltage generating circuit for generating a word line voltage and a bit line voltage at defined target levels in response to a high voltage enable signal, the word line voltage being applied to the selected word line through the row selecting circuit;
   a voltage level sensing circuit for generating a pulse signal when the word line voltage and the bit line voltage reach their target levels;
   a column selecting circuit for selecting at least one of the bit lines in response to a column address;
   a program controller for generating the high voltage enable signal in response to a program enable signal indicating a start of the program operation, and for generating a control signal in response to the pulse signal after a defined time elapses, the control signal indicating a time when the bit line voltage is applied to the selected bit line; and
   a write driver circuit for driving the selected bit line with the bit line voltage at its defined target level depending on data to be programmed in a memory cell associated with the selected word line and bit line when the control signal thus generated is applied.

9. The memory device according to claim 8, further comprising a command register for generating the program enable signal in response to command codes, which are defined by address and data supplied by an external controller in synchronism with a write enable signal.

10. The memory device according to claim 8, wherein the voltage level sensing circuit comprises:
   a first level detector for activating a first detection signal when the word line voltage is boosted up to its target level;
   a second level detector for activating a second detection signal when the bit line voltage is boosted up to its target level; and
   a pulse generator for generating the pulse signal when the first and second detection signals are activated.

* * * * *

UNITED STATES PATENT AND TRADEMARK OFFICE
CERTIFICATE OF CORRECTION

PATENT NO. : 6,128,231 Page 1 of 1
DATED : October 3, 2000
INVENTOR(S) : Chung

It is certified that error appears in the above-identified patent and that said Letters Patent is hereby corrected as shown below:

Column 4,
Line 40, "semiconductor; memory" should read -- semiconductor memory --.

Column 6,
Line 13, "VPP2 OK" should read -- VPP2__OK --.

Signed and Sealed this

Twenty-sixth Day of March, 2002

Attest:

JAMES E. ROGAN
Attesting Officer
Director of the United States Patent and Trademark Office